(12) United States Patent  
Uejima

(10) Patent No.: US 8,368,484 B2  
(45) Date of Patent: Feb. 5, 2013

(54) HIGH-FREQUENCY MODULE

(75) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 297 days.

(21) Appl. No.: 12/906,212

(22) Filed: Oct. 18, 2010

(65) Prior Publication Data

US 2011/0109401 A1 May 12, 2011

(30) Foreign Application Priority Data

Nov. 11, 2009 (JP) ................................. 2009-258300

(51) Int. Cl.
H01P 1/10 (2006.01)
H02H 3/22 (2006.01)

(52) U.S. Cl. ......................... 333/101; 333/104; 361/118
(58) Field of Classification Search .................. 333/101, 333/103, 104; 361/118
See application file for complete search history.

(56) References Cited

U.S. PATENT DOCUMENTS

| | | | |
|---|---|---|---|
| 7,057,472 B2 * | 6/2006 | Fukamachi et al. | 333/101 |
| 7,295,814 B2 * | 11/2007 | Yamashita et al. | 455/83 |
| 7,492,565 B2 * | 2/2009 | Block et al. | 361/119 |
| 2005/0176380 A1 | 8/2005 | Okabe et al. | |
| 2009/0003286 A1 | 1/2009 | Korden et al. | |
| 2009/0067103 A1 | 3/2009 | Kijima et al. | |

FOREIGN PATENT DOCUMENTS

| | | |
|---|---|---|
| JP | 5-102672 A | 4/1993 |
| JP | 05-267494 A | 10/1993 |
| JP | 2000-184576 A | 6/2000 |
| JP | 2005-223582 A | 8/2005 |
| JP | 2006-253834 A | 9/2006 |
| JP | 2006-310904 A | 11/2006 |
| JP | 2007-207857 A | 8/2007 |
| JP | 2007-324858 A | 12/2007 |
| JP | 2008-516494 A | 5/2008 |
| JP | 2009-089165 A | 4/2009 |

OTHER PUBLICATIONS

Official Communication issued in corresponding Japanese Patent Application No. 2009-258300, mailed on Jan. 5, 2012.
Official Communication issued in corresponding Japanese Patent Application No. 2009-258300, mailed on Mar. 21, 2012.
Official Communication issued in corresponding Korean Patent Application No. 10-2010-0104487, mailed on Jan. 27, 2012.

* cited by examiner

Primary Examiner — Dean O Takaoka
(74) Attorney, Agent, or Firm — Keating & Bennett, LLP

(57) ABSTRACT

A high-frequency switch module includes an ESD device, a switch IC, and a SAW filter element that are mounted on the surface of a multilayer substrate. A ground-side land for the ESD device is connected to an external-connection ground electrode for the ESD device by via holes and plane electrode patterns. A ground connection land for the switch IC and a ground connection land for the SAW filter element are connected to a common inner ground electrode by via holes, and are connected to a common external-connection ground electrode by via holes and another common inner ground electrode.

8 Claims, 8 Drawing Sheets

HIGH-FREQUENCY MODULE

BACKGROUND OF THE INVENTION

1. Field of the Invention

The present invention relates to high-frequency modules for transmitting or receiving various types of high-frequency communication signals with a switch IC provided therein and an antenna and, more particularly, to a high-frequency module including an electrostatic discharge (ESD) protection device.

2. Description of the Related Art

Various high-frequency switch modules including a switch IC and a plurality of transmission circuits, reception circuits, and transmission/reception circuits which are connected to a single antenna via the switch IC have been proposed.

Such a high-frequency switch module typically includes a multilayer substrate. A switch IC is disposed on the multilayer substrate. An antenna transmission circuit, a transmission circuit, a reception circuit, and a transmission/reception circuit which are connected to the switch IC are defined by electrode patterns provided on the surfaces of the multilayer substrate, an electrode pattern provided in the multilayer substrate, and a surface-mounted component.

In high-frequency switch modules including a switch IC, in order to prevent the switch IC from being destroyed or damaged by a voltage surge externally applied thereto via an antenna, an electrostatic discharge protection device (hereinafter referred to as an ESD device) is disposed in a transmission circuit connecting the switch IC and the antenna. The ESD device is, for example, an inductor, and is connected between a transmission line arranged to connect the antenna and the switch IC and the ground. Since ESD devices typically must have a high withstand voltage, they are usually used as mounting components.

Since such an ESD device that is a mounting component and a switch IC are disposed on the surface of a multilayer substrate, it is necessary to provide a ground connection line arranged to connect the ESD device to the ground in the multilayer substrate.

As disclosed in Japanese Unexamined Patent Application Publication No. 2008-516494, a common ground electrode is disposed in a multilayer substrate and ground terminals of the switch IC and the ESD device are connected to the common ground electrode. The common ground electrode is connected to a common external-connection ground electrode disposed on the bottom surface of the multilayer substrate for external connection to the ground.

However, when both of the ESD device and the switch IC are connected to the common ground electrode, the following problem occurs. FIG. 8 is a schematic cross-sectional view describing a problem of a high-frequency switch module in the related art. In FIG. 8, only a pattern of lines connected to the ground is illustrated and the illustration of other line patterns is omitted.

A high-frequency switch module 10P in the related art includes a multilayer substrate 200P. An ESD device 110, a switch IC 121, and a SAW filter element 122 are disposed on the surface of the multilayer substrate 200P. Inner common ground electrodes 201P and 202P are provided in the multilayer substrate 200P. The inner common ground electrode 201P is connected to a ground land on which the ESD device 110 is disposed by a via hole 220, is connected to a ground land on which the switch IC 121 is disposed by a via hole 221, and is connected to a ground land on which the SAW filter element 122 is disposed by a via hole 222.

The inner common ground electrodes 201P and 202P are connected to each other by a plurality of via holes 230. The inner common ground electrode 202P is connected to an external-connection ground electrode 210 that is provided on the bottom surface of the multilayer substrate 200P by via holes 240.

As represented by a chain double-dashed line in FIG. 8, an external current surge flowing from the ESD device 110 to the external-connection ground electrode 210 enters the switch IC 121 and the SAW filter element 122 via the inner common ground electrode 201P. This causes a malfunction of the switch IC 121 and destroys or damages the switch IC 121 and the SAW filter element 122 which have low surge tolerances.

SUMMARY OF THE INVENTION

To overcome the problems described above, preferred embodiments of the present invention prevent a current surge that is generated by an external voltage surge and should flow from an ESD device to the ground from entering other circuit components, such as a switch IC.

A high-frequency switch module according to a preferred embodiment of the present invention includes a switch IC that includes a single common port connected to an antenna and a plurality of separate ports individually connected to a plurality of transmission/reception circuits and can switch between the plurality of separate ports to be connected to the common port, an ESD device connected between a ground and a transmission line arranged to connect the common port of the switch IC and the antenna, and a multilayer substrate including an upper surface on which the switch IC and the ESD device are mounted and a lower surface on which a first external-connection ground electrode arranged to connect the ESD device to the ground and a second external-connection ground electrode arranged to connect the switch IC and the plurality of transmission/reception circuits to the ground are provided. A first ground connection path connecting the ESD device to the first external-connection ground electrode and a second ground connection path connecting the switch IC and a circuit element included in the plurality of transmission/reception circuits to the second external-connection ground electrode are separately provided in the multilayer substrate.

The first ground connection path for the ESD device and the second ground connection path for the switch IC and the circuit element included in the transmission/reception circuits are not connected to each other in the multilayer substrate. As a result, a current surge flowing from the ESD device to the ground does not directly enter the switch IC and the circuit element included in the transmission/reception circuits.

The first ground connection path includes a plane electrode pattern that is provided in an inner layer of the multilayer substrate and extends in a direction perpendicular or substantially perpendicular to a lamination direction of the multilayer substrate and a conductive via hole that is provided in the multilayer substrate and extends in the lamination direction thereof.

By combining a plane electrode pattern and a via hole so as to define the first ground connection path connecting the ESD device to the ground as described above, the flexibility of a routing pattern in the multilayer substrate is improved.

In the multilayer substrate, the plane electrode pattern of the first ground connection path is provided in the inner layer that is preferably different from an inner layer in which a plane electrode pattern included in the second ground connection path is provided.

Since the plane electrode pattern included in the first ground connection path for the ESD device and the plane electrode pattern included in the second connection path for the switch IC and the transmission/reception circuit element are provided in different layers, coupling between these plane electrode patterns does not occur. Therefore, it is possible to effectively prevent the switch IC and the transmission/reception circuit element from being destroyed by an externally applied voltage surge.

The first ground connection path is preferably defined by only a conductive via hole that connects a mounting land on which the ESD device is mounted and the first external-connection ground electrode to each other and extends in the lamination direction.

Since the distance between the ESD device and the first external-connection ground electrode is very short, a current surge can be easily passed to the ground.

On the lower surface of the multilayer substrate, a region in which the first external-connection ground electrode is arranged preferably has an area substantially equal to or greater than that of regions in which all of other external-connection electrodes are arranged.

Since the area of the first external-connection ground electrode is large, a current surge from the ESD device more easily flows to the external ground.

In the first ground connection path, a plurality of conductive via holes extending in the lamination direction are preferably connected to the first external-connection ground electrode.

Since a plurality of conductive via holes are provided, a current surge from the ESD device more easily flows to the external ground.

A high-frequency switch module according to a preferred embodiment of the present invention preferably further includes a capacitor connected in series to the transmission line connected to the ESD device.

By connecting the capacitor to the transmission line arranged to connect the antenna and the switch IC, a surge tolerance is improved.

The circuit element included in the plurality of transmission/reception circuits is a preferably SAW filter element connected to predetermined ones of the plurality of separate ports of the switch IC.

Even when a high-frequency switch module including a SAW filter in transmission/reception circuits is used, it is possible to prevent a switch IC and the SAW filter from being destroyed or damaged by an external surge.

According to a preferred embodiment of the present invention, it is possible to prevent a current surge flowing from an ESD device to the ground from entering a circuit element, such as a switch IC. As a result, it is possible to prevent the switch IC from being destroyed or damaged by an external surge.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
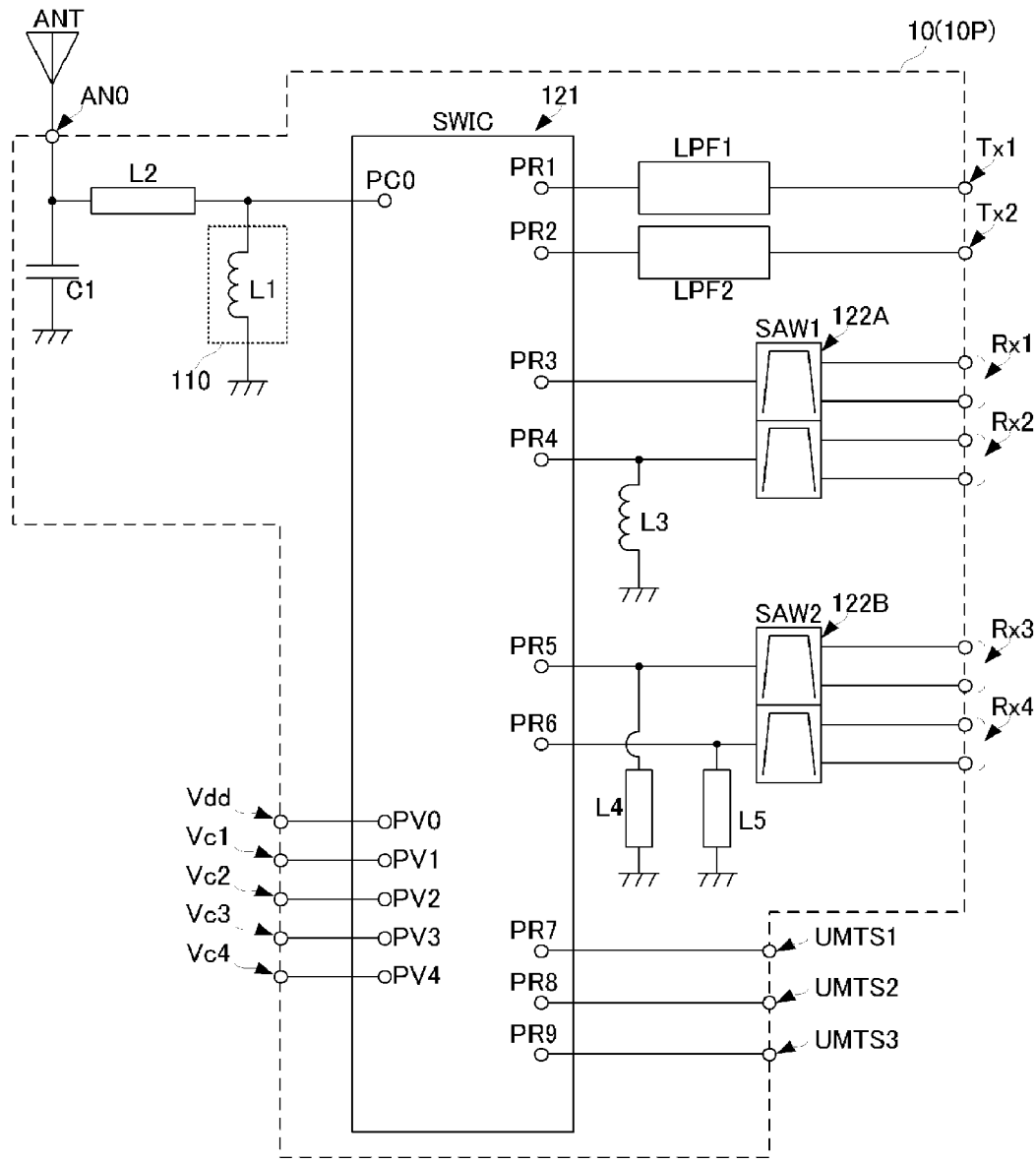
FIG. 1 is a circuit diagram illustrating a schematic circuit configuration of a high-frequency switch module according to a first preferred embodiment of the present invention.

A high-frequency switch module according to a first preferred embodiment of the present invention will be described with reference to the accompanying drawings. The circuit configuration of a high-frequency switch module 10 according to the first preferred embodiment of the present invention will be described with reference to FIG. 1. FIG. 1 is a circuit diagram illustrating a schematic circuit configuration of the high-frequency switch module 10.

The high-frequency switch module 10 includes a plurality of external-connection electrodes. These external-connection electrodes are arranged to mount the high-frequency switch module 10 including a multilayer substrate 200 on a mother circuit board. For simplification of explanation, the external-connection electrodes of the high-frequency switch module 10 are hereinafter referred to as "electrodes" and mounting electrodes of the switch IC 121 arranged to mount the switch IC 121 on the multilayer substrate are hereinafter referred to as "ports."

These external-connection electrodes include an external antenna electrode AN0, external transmission electrodes Tx1 and Tx2, external reception electrodes Rx1, Rx2, Rx3, and Rx4, external transmission/reception electrodes UMTS1, UMTS2, and UMTS3, an external drive voltage input electrode Vdd, and external control voltage input electrodes Vc1, Vc2, Vc3, and Vc4. Although not illustrated in FIG. 1, the external-connection electrodes also include a ground electrode.

The switch IC 121 has, for example, a CMOS structure, and is preferably an SP9T-type FET switch IC that is substantially rectangular in plan view. The switch IC 121 includes an antenna port PC0 corresponding to a common port according to a preferred embodiment of the present invention, RF ports PR1 to PR9 corresponding to separate ports according to a preferred embodiment of the present invention, and driving signal input ports PV0 to PV4. The switch IC 121 is driven by a drive voltage Vdd received by the driving signal input port PV0, and functions to selectively connect the antenna port PC0 to one of the RF ports PR1 to PR9 in accordance with the combination of control voltage signals Vc1 to Vc4 received by the driving signal input ports PV1 to PV4. In this preferred embodiment, an SP9T-type switch IC, for example, is preferably used. However, an SPnT-type (n represents a positive number equal to or greater than two) may be used.

Next, the circuit configuration of the switch IC 121 on the side of an antenna will be described.

The antenna port PC0 of the switch IC 121 is connected to the external antenna electrode AN0 of the high-frequency switch module 10 via an inductor L2. The external antenna electrode AN0 is connected to an antenna ANT.

One end of an inductor L1 is connected to a transmission line between the antenna port PC0 of the switch IC 121 and the inductor L2, and the other end of the inductor L1 is connected to the ground. Even if a voltage surge is externally applied via the antenna ANT and the external antenna electrode AN0, a current surge flows to the ground via the inductor L1. That is, the inductor L1 functions as an ESD device. The inductor L1 preferably has a high withstand voltage, and is therefore defined by a mounting component. The inductor L1 is mounted on the surface of the multilayer substrate 200.

One end of the inductor L2 on the side of the external antenna electrode AN0 is connected to the ground via a capacitor C1.

Next, the circuit configuration of the switch IC 121 on the RF side, that is, the circuit configuration of a transmission/reception circuit, will be described.

Figure 3:
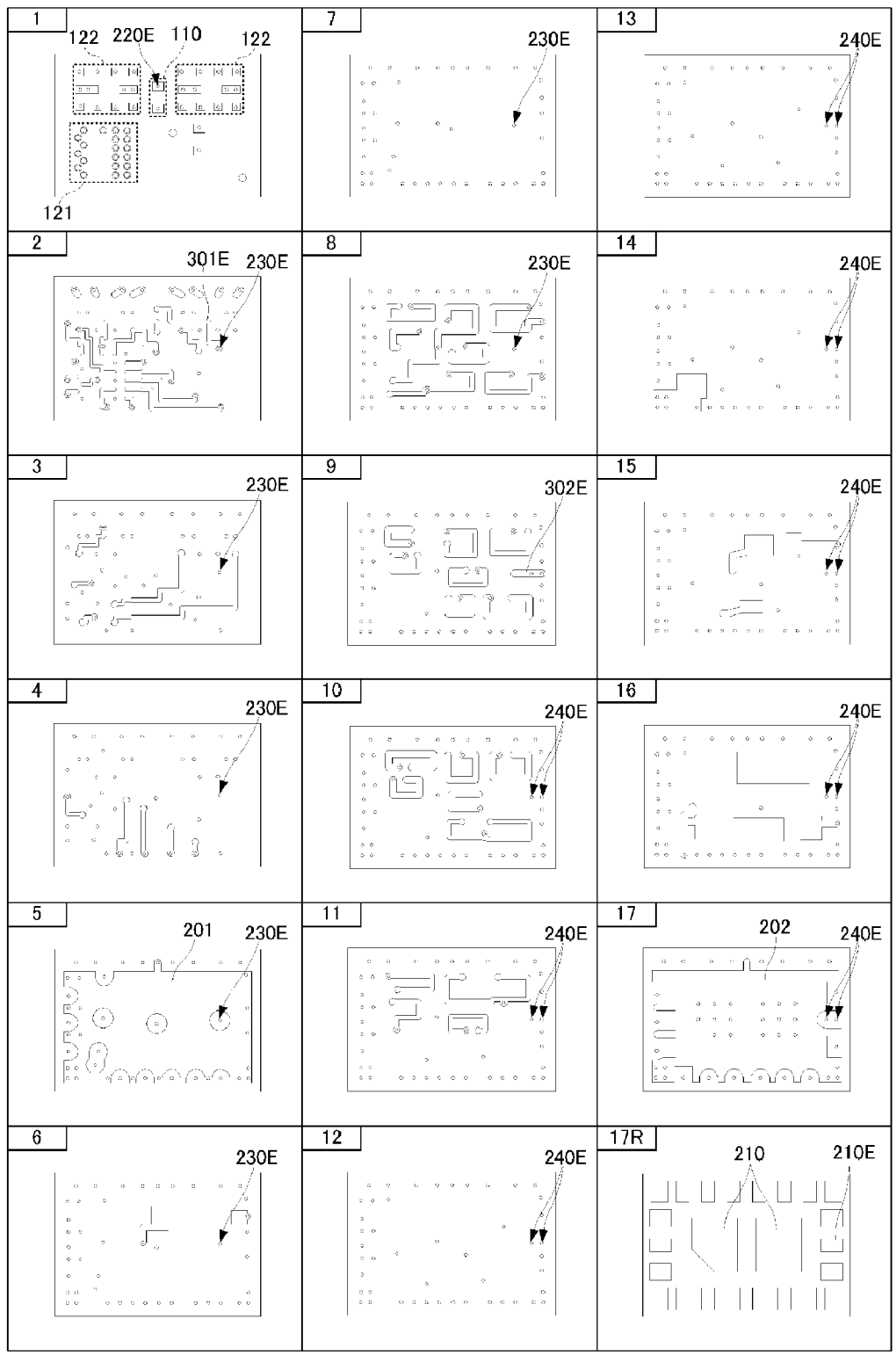
FIG. 3 is a lamination diagram of a multilayer substrate of a high-frequency switch module according to the first preferred embodiment of the present invention.

The external transmission electrode Tx1 is connected to the RF port PR1 of the switch IC 121 via a low-pass filter LPF1. The low-pass filter LPF1 includes an inductor and a capacitor. The frequency characteristics of the low-pass filter LPF1 is set so that a predetermined frequency band is a passband. For example, the frequency characteristic of the low-pass filter LPF1 is set so that the frequency band of a GSM-850 or GSM-900 transmission signal is a passband and the frequency band of a harmonic of the GSM-850 or GSM-900 transmission signal is an attenuation band. The inductor and the capacitor included in the low-pass filter LPF1 are defined by an inner electrode pattern provided in the multilayer substrate 200 and a mounting component. Referring to FIG. 3, the inductor and the capacitor are preferably defined solely by an inner electrode pattern provided in the multilayer substrate 200.

The external transmission electrode Tx2 is connected to the RF port PR2 of the switch IC 121 via a low-pass filter LPF2. The low-pass filter LPF2 also includes an inductor and capacitor. The frequency characteristic of the low-pass filter LPF2 is preferably set so that a predetermined frequency band different from the passband of the low-pass filter LPF1 is a passband. For example, the frequency characteristic of the low-pass filter LPF2 is set so that the frequency band of a GSM-1800 or GSM-1900 transmission signal is a passband and the frequency band of a harmonic of the GSM-1800 or GSM-1900 transmission signal is an attenuation band. The inductor and the capacitor included in the low-pass filter LPF2 are defined by an inner electrode pattern provided in the multilayer substrate 200 and a mounting component. Referring to FIG. 3, the inductor and the capacitor are preferably defined solely by an inner electrode pattern formed in the multilayer substrate 200.

The balanced external reception electrode Rx1 is connected the RF port PR3 of the switch IC 121 via a SAW filter SAW1. The balanced external reception electrode Rx2 is connected to the RF port PR4 of the switch IC 121 via the SAW filter SAW1.

The SAW filter SAW1 preferably includes two SAW filters having different frequency bands as passbands. For example, the frequency band of a GSM-850 received signal is preferably set as a passband of the SAW filter SAW1 for a transmission line arranged to connect the RF port PR3 and the external reception electrode Rx1, and the frequency band of a GSM-900 received signal is preferably set as a passband of the SAW filter SAW1 for a transmission line arranged to connect the RF port PR4 and the external reception electrode Rx2. The SAW filter SAW1 is preferably a SAW filter element 122A that is a mounting component, and is mounted on the surface of the multilayer substrate 200.

A transmission line arranged to connect the RF port PR4 of the switch IC 121 and the SAW filter SAW1 is connected to the ground via an impedance matching inductor L3.

The balanced external reception electrode Rx3 is connected to the RF port PR5 of the switch IC 121 via a SAW filter SAW2. The balanced external reception electrode Rx4 is connected to the RF port PR6 of the switch IC 121 via the SAW filter SAW2.

The SAW filter SAW2 preferably includes two SAW filters having different frequency bands as passbands. For example, the frequency band of a GSM-1800 received signal is preferably set as a passband of the SAW filter SAW2 for a transmission line arranged to connect the RF port PR5 and the external reception electrode Rx3, and the frequency band of a GSM-1900 received signal is preferably set as a passband of the SAW filter SAW2 for a transmission line arranged to connect the RF port PR6 and the external reception electrode Rx4. Similar to the SAW filter SAW1, the SAW filter SAW2 is preferably a SAW filter element 122B that is a mounting component, and is mounted on the surface of the multilayer substrate 200.

A transmission line arranged to connect the RF port PR5 of the switch IC 121 and the SAW filter SAW2 is connected to the ground via an impedance matching inductor L4. A transmission line arranged to connect the RF port PR6 of the switch IC 121 and the SAW filter SAW2 is connected to the ground via an impedance matching inductor L5.

The RF ports PR7, PR8, and PR9 of the switch IC 121 are connected to the external transmission/reception electrodes UMTS1, UMTS2, and UMTS3, respectively.

Next, a driving signal input circuit arranged to cause the switch IC 121 in the high-frequency switch module to perform the above-described switching control processing will be described. The driving signal input port PV0 of the switch IC 121 is connected to the external drive voltage input electrode Vdd. The driving signal input ports PV1, PV2, PV3, and PV4 of the switch IC 121 are connected to the external control voltage input electrodes Vc1, Vc2, Vc3, and Vc4, respectively.

Figure 2:
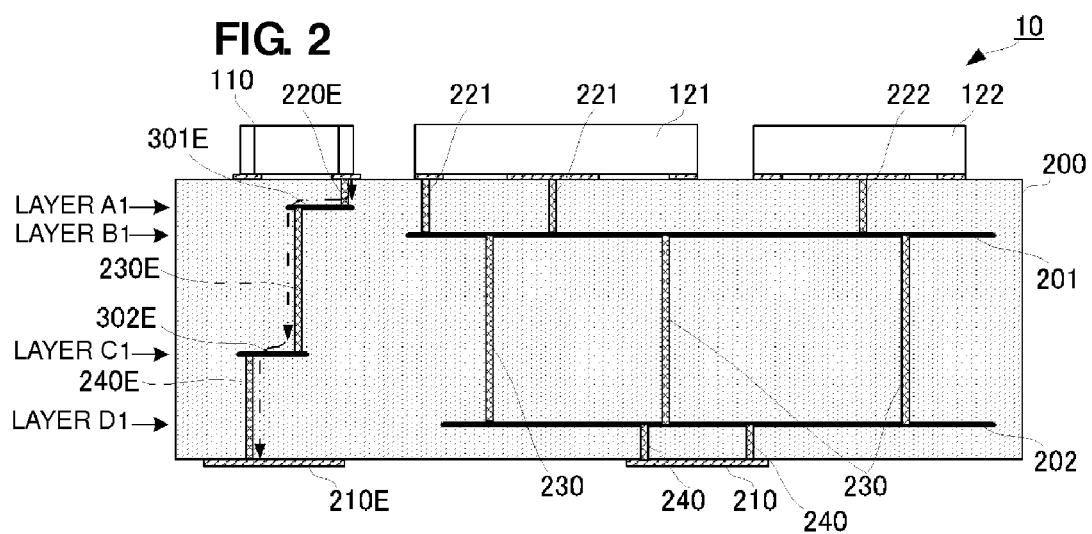
FIG. 2 is a cross-sectional view of a high-frequency switch module according to the first preferred embodiment of the present invention.

Next, the configuration of the high-frequency switch module 10 according to this preferred embodiment will be described. FIG. 2 is a cross-sectional view of the high-frequency switch module 10. FIG. 3 is a lamination diagram of the multilayer substrate 200 of the high-frequency switch module 10.

The multilayer substrate 200 of the high-frequency switch module 10 includes a plurality of stacked dielectric layers preferably made of ceramic or a resin, for example. Circuit patterns other than the switch IC 121, the SAW filters SAW1 (including the SAW filter element 122A) and SAW2 (including the SAW filter element 122B), the inductor L1 that defines the ESD device 110, and the inductor L3 in the high-frequency switch module 10 illustrated in FIG. 1 are defined by electrodes arranged in predetermined patterns that are provided in inner layers between the dielectric layers and the top and bottom surfaces of the stack. The mounting circuit components are mounted on the surface of the multilayer substrate 200.

The configuration of the high-frequency switch module 10 according to this preferred embodiment will be described with reference to FIG. 2. In FIG. 2, only a circuit pattern connected to the ground is illustrated, and the illustration of other circuit patterns is omitted. Only one of the SAW filter elements 122A and 122B is illustrated as the SAW filter element 122.

The ESD device 110, the switch IC 121, and the SAW filter element 122 are individually disposed at predetermined locations on the upper surface of the multilayer substrate 200.

A via hole 220E extending in a lamination direction of the multilayer substrate 200 connects a ground-side land of the ESD device 110 to a plane electrode pattern 301E provided in a layer A1 in the multilayer substrate 200. The plane electrode pattern 301E extends in a direction perpendicular or substantially perpendicular to the lamination direction. Unless otherwise specified, each via hole extends in the lamination direction and each plane electrode pattern extends in the direction perpendicular or substantially perpendicular to the lamination direction.

The plane electrode pattern 301E in the layer A1 is connected to a plane electrode pattern 302E in a layer C1 by a via hole 230E. The plane electrode pattern 302E in the layer C1 is connected to an external-connection ground electrode 210E, corresponding to a first external-connection ground electrode according to a preferred embodiment of the present invention, for the ESD device 110 by a via hole 240E.

A ground connection land of the switch IC 121 is connected to a common ground electrode 201 in a layer B1 by via holes 221. A ground connection land of the SAW filter element 122 is connected to the common ground electrode 201 in the layer B1 by a via hole 222.

The common ground electrode 201 in the layer B1 is connected to a common ground electrode 202 in a layer D1 by via holes 230. The common ground electrode 202 in the layer D1 is connected to an external-connection ground electrode 210 (corresponding to a second external-connection ground electrode according to a preferred embodiment of the present invention) by via holes 240.

Thus, in this preferred embodiment, the external-connection ground electrode 210E for the ESD device 110 and the external-connection ground electrode 210 for the switch IC 121 and the SAW filter element 122 are separately provided on the lower surface of the multilayer substrate 200.

A ground connection path arranged to connect the ESD device 110 to the external-connection ground electrode 210E and a ground connection path arranged to connect the switch IC 121 and the SAW filter element 122 to the external-connection ground electrode 210 are not connected in the multilayer substrate 200. As a result, a current surge generated by the application of a voltage surge to the ESD device 110 flows into the external-connection ground electrode 210E as represented by a chain double-dashed line in FIG. 2 and does not enter the switch IC 121 and the SAW filter element 122. Therefore, it is possible to prevent the switch IC and the SAW filter element from being destroyed or damaged by an externally applied voltage surge even if the ESD device in the related art is provided.

By arranging the plane electrode patterns 301E and 302E on a path connected to the ESD device 110 so that they do not overlap the common ground electrodes 201 and 202 in a plan view of the multilayer substrate 200 as illustrated in FIG. 2, coupling between the plane electrode patterns 301E and 302E and the common ground electrodes 201 and 202 is effectively prevented. Therefore, it is possible to effectively prevent a switch IC and a SAW filter element from being destroyed or damaged by an externally applied voltage surge. Furthermore, as illustrated in FIG. 2, by arranging the plane electrode patterns 301E and 302E and the common ground electrodes 201 and 202 in different layers, coupling between the plane electrode patterns 301E and 302E and the common ground electrodes 201 and 202 is effectively prevented. Therefore, it is possible to more effectively prevent a switch IC and a SAW filter element from being destroyed or damaged by an externally applied voltage surge.

Next, a layered structure of the high-frequency switch module 10 according to this preferred embodiment will be described in detail below with reference to FIG. 3. FIG. 3 is a diagram illustrating an electrode pattern obtained when each layer in the multilayer substrate 200 is viewed along a lamination direction. A first layer corresponding to the upper surface of the multilayer substrate 200 to a seventeenth layer are illustrated in this order. An electrode pattern on the surface of each of the first to seventeenth layers is illustrated. An electrode pattern illustrated in a layer 17R is an electrode pattern on the lower surface of the seventeenth layer, that is, an electrode pattern on the lower surface of the multilayer substrate 200. In FIG. 3, circles in each layer represent via holes passing through the thickness of the layer. With these via holes, electric connections between layers are provided. Only line patterns connected to the ground will be described below, and the description of other line patterns will be omitted.

The first layer corresponds to the upper surface of the multilayer substrate 200, that is, a mounting surface. A mounting land having a predetermined pattern on which the ESD device 110, the switch IC 121, and the two SAW filter elements 122 are mounted is provided on the first layer. An electrode disposed in the lower right portion of the first layer is used for the inductor L3. The via hole 220E illustrated in FIG. 2 is formed in the first layer.

On the second layer, the plane electrode pattern 301E is provided. One end of the plane electrode pattern 301E is connected to a land for the ESD device 110 on the first layer by the via hole 220E.

The via hole 230E extends from the second layer to the eighth layer. One end portion of the via hole 230E in the second layer is connected to the other end of the plane electrode pattern 301E provided on the second layer.

The common ground electrode 201 is provided on substantially the entire surface of the fifth layer except for a region having a predetermined area in which the via hole 230E is provided. By arranging the via hole 230E and the common ground electrode 201 so as to be spaced apart from each other by a distance equal to or greater than a predetermined distance as described previously, coupling between the via hole 230E and the common ground electrode 201 is prevented.

The plane electrode pattern 302E is provided on the ninth layer. One end of the plane electrode pattern 302E is connected to the via hole 230E. In the high-frequency switch module 10 having the illustrated layered structure, a region is provided in which the plane electrode pattern 302E overlaps the common ground electrodes 201 and 202 in plan view of the high-frequency switch module 10. However, since the plane electrode pattern 302E is a strip electrode having a predetermined width, the region in which the plane electrode pattern 302E overlaps the common ground electrodes 201 and 202 is extremely small, and the plane electrode pattern 302E and the common ground electrodes 201 and 202 are provided in different layers that are spaced apart from one another by a plurality of layers, coupling between the plane electrode pattern 302E and each of the common ground electrodes 201 and 202 does not occur to any significant extent. Even when a design must be implemented in which the plane electrode pattern 302E overlaps the common ground electrodes 201 and 202, it is possible to obtain the above-described operational effect by appropriately setting the area of a region in which they overlaps one another and a distance between the plane electrode pattern 302E and the common ground electrodes 201 and 202.

The two via holes 240E extend from the ninth layer to the seventeenth layer in parallel or substantially in parallel to each other. One end portions of the via holes 240E in the ninth layer are connected to the other end of the plane electrode pattern 302E provided on the ninth layer.

The common ground electrode 202 is provided on substantially the entire surface of the seventeenth layer except for a region having a predetermined area in which the via holes 240E are provided. As a result, coupling between the common ground electrode 202 and each of the via holes 240E is prevented.

On the lower surface of the seventeenth layer, that is, on the lower surface of the layer 17R, various external-connection electrodes are provided. One of the external-connection electrodes is connected to the via holes 240E. The external-connection electrode connected to the via holes 240E defines the external-connection ground electrode 210E for the ESD device.

At a central portion of the layer 17R, the external-connection ground electrode 210 is provided. The external-connection ground electrode 210 is connected to the common ground electrode 202 provided on the seventeenth layer by via holes.

In the high-frequency switch module 10 having the above-described layered structure, as described above, a path connecting the ESD device 110 to the ground and a path connecting the switch IC 121 and the SAW filter element 122 to the ground are not connected to each other in the multilayer substrate 200, and are connected to different external-connection ground electrodes. As a result, a switch IC is effectively protected against an external surge.

In the above-described layered structure, the two via holes 240E are arranged parallel or substantially parallel to each other. The number of the via holes 240E may preferably be one or three or more, for example. By arranging a plurality of via holes in parallel or substantially in parallel to one another, a current surge is more effectively passed to the external-connection ground electrode 210E.

In the above-described layered structure, the path connecting the ESD device to the ground includes plane electrode patterns. With the layered structure, the land for the ESD device 110 and the external-connection ground electrode 210E are securely connected to each other even when the position of the ESD device 110 and the position of the external-connection ground electrode 210E for the ESD device 110 do not overlap. As a result, even when a path connecting an ESD device to the ground is provided, design flexibility is improved.

Figure 4:
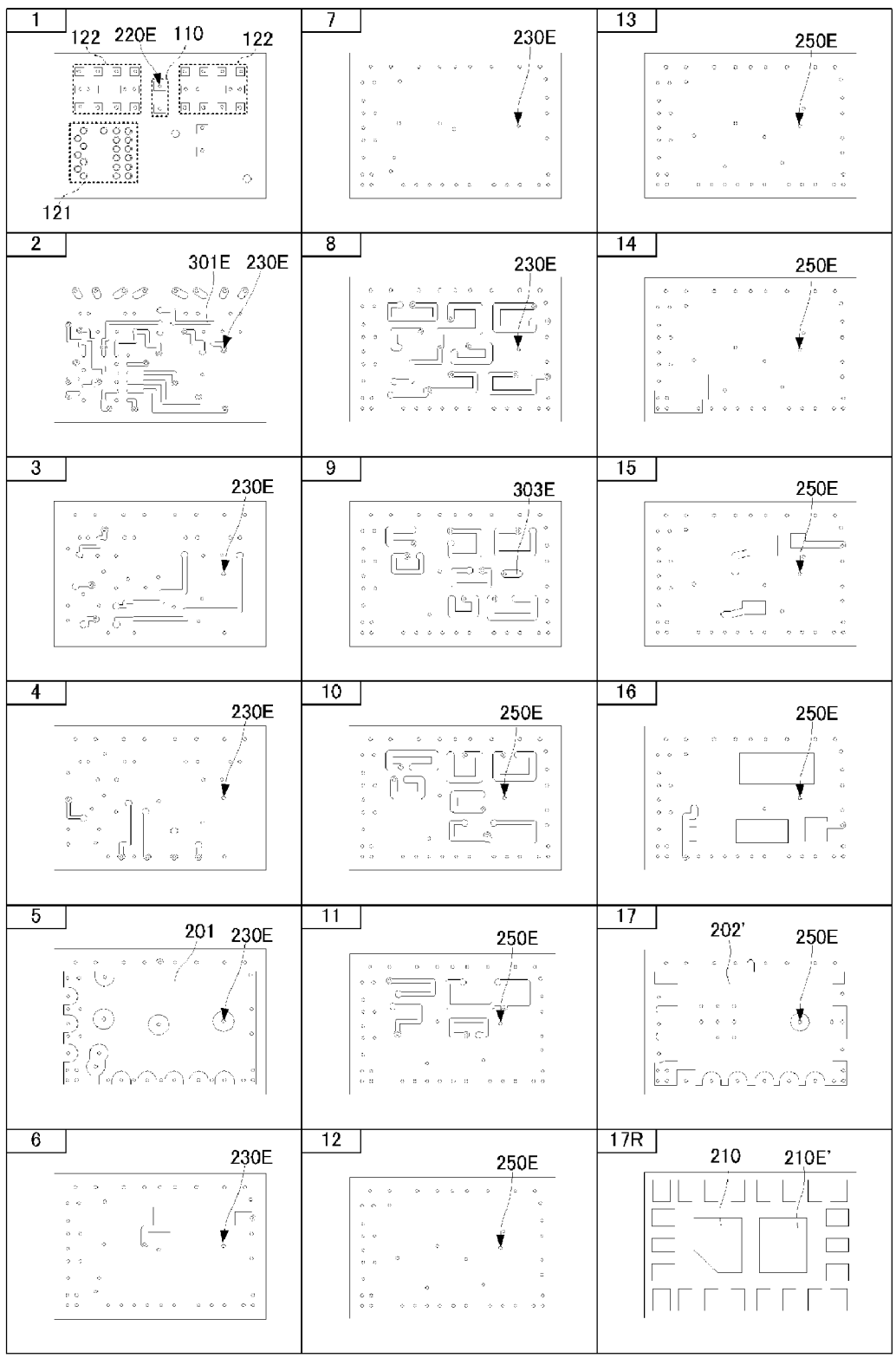
FIG. 4 is a lamination diagram of a multilayer substrate of a high-frequency switch module according to a second preferred embodiment of the present invention.

Next, a high-frequency switch module according to a second preferred embodiment of the present invention will be described with reference to the accompanying drawing. FIG. 4 is a lamination diagram of a multilayer substrate 200' of the high-frequency switch module 10 according to the second preferred embodiment. The circuit configuration of the high-frequency switch module 10 according to the second preferred embodiment is substantially the same as that of the high-frequency switch module 10 according to the first preferred embodiment, and the description thereof will therefore be omitted. The layered structure of the first to eighth layers of the multilayer substrate 200' is substantially the same as that of the multilayer substrate 200, and a description of only layers below the eighth layer will be provided.

A plane electrode pattern 303E is provided on a ninth layer. One end of the plane electrode pattern 303E is connected to the via hole 230E.

A via hole 250E extends from the ninth layer to a seventeenth layer. One end portion of the via hole 250E in the ninth layer is connected to the other end of the plane electrode pattern 303E provided on the ninth layer.

A common ground electrode 202' is provided on substantially the entire surface of the seventeenth layer except for a region having a predetermined area in which the via hole 250E is provided. As a result, coupling between the via hole 250E and the common ground electrode 202' is effectively prevented.

On the lower surface of the seventeenth layer, that is, on the lower surface of the layer 17R, various external-connection electrodes are provided. One of these external-connection electrodes is connected to the via hole 250E. The external-connection electrode connected to the via hole 250E is an external-connection ground electrode 210E' for the ESD device. The area of the external-connection ground electrode 210E' is greater than that of the other external-connection electrodes.

On the surface of the layer 17R, the external-connection ground electrode 210 is provided. The external-connection ground electrode 210 is connected to the common ground electrode 202' provided on the seventeenth layer by via holes.

By configuring the external-connection ground electrode 210E' so as to have a large area for the ESD device 110 as described above, a current surge is easily passed from the ESD device 110 to the external ground. Therefore, it is possible to more effectively protect a switch IC from an external surge.

Next, a high-frequency switch module according to a third preferred embodiment of the present invention will be described with reference to the accompanying drawing. The circuit configuration of a high-frequency switch module 10A according to the third preferred embodiment is substantially the same as that of the high-frequency switch module 10 according to the first preferred embodiment, and the description thereof will therefore be omitted. The difference between the high-frequency switch module 10A and the high-frequency switch module 10 is only a path connecting the ESD device 110 to the external-connection ground electrode 210E.

Figure 5:
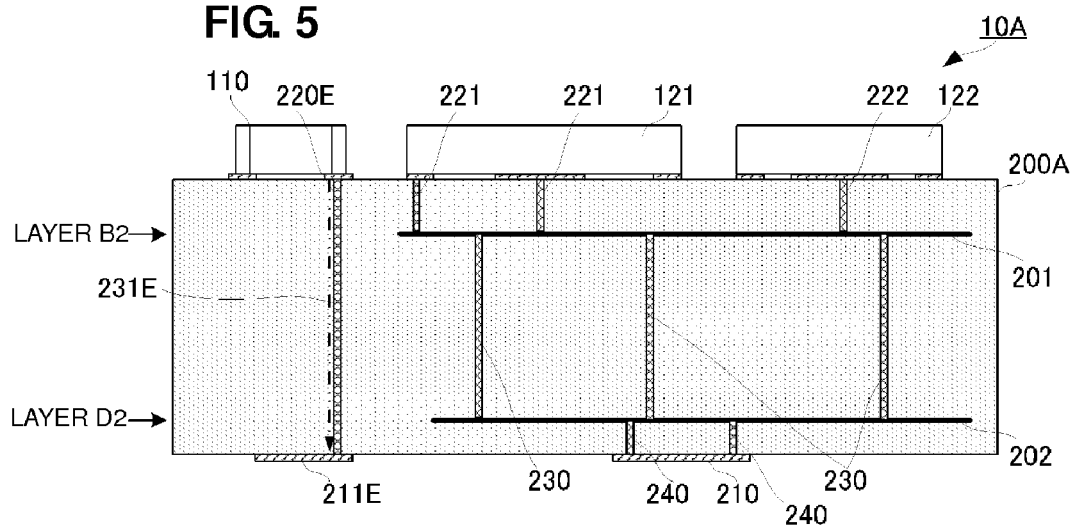
FIG. 5 is a cross-sectional view of a high-frequency switch module according to a third preferred embodiment of the present invention.

FIG. 5 is a cross-sectional view of the high-frequency switch module 10A.

In a multilayer substrate 200A included in the high-frequency switch module 10A, a path that includes the common ground electrodes 201 and 202 and the external-connection ground electrode 210 and is used to connect the switch IC 121 and the SAW filter element 122 to the ground is substantially the same as the path in the first preferred embodiment of the present invention.

On the other hand, a ground-side land for the ESD device 110 is directly connected to an external-connection ground electrode 211E by a via hole 231E that passes through the multilayer substrate 200A in the lamination direction.

Unlike in the first preferred embodiment, a plane electrode pattern is not provided in the multilayer substrate 200A. Accordingly, the distance between the ground-side land for the ESD device 110 and the external-connection ground electrode 211E is reduced. As a result, a surge externally applied to the ESD device 110 can be more effectively and reliably passed to the external ground.

Figure 6:
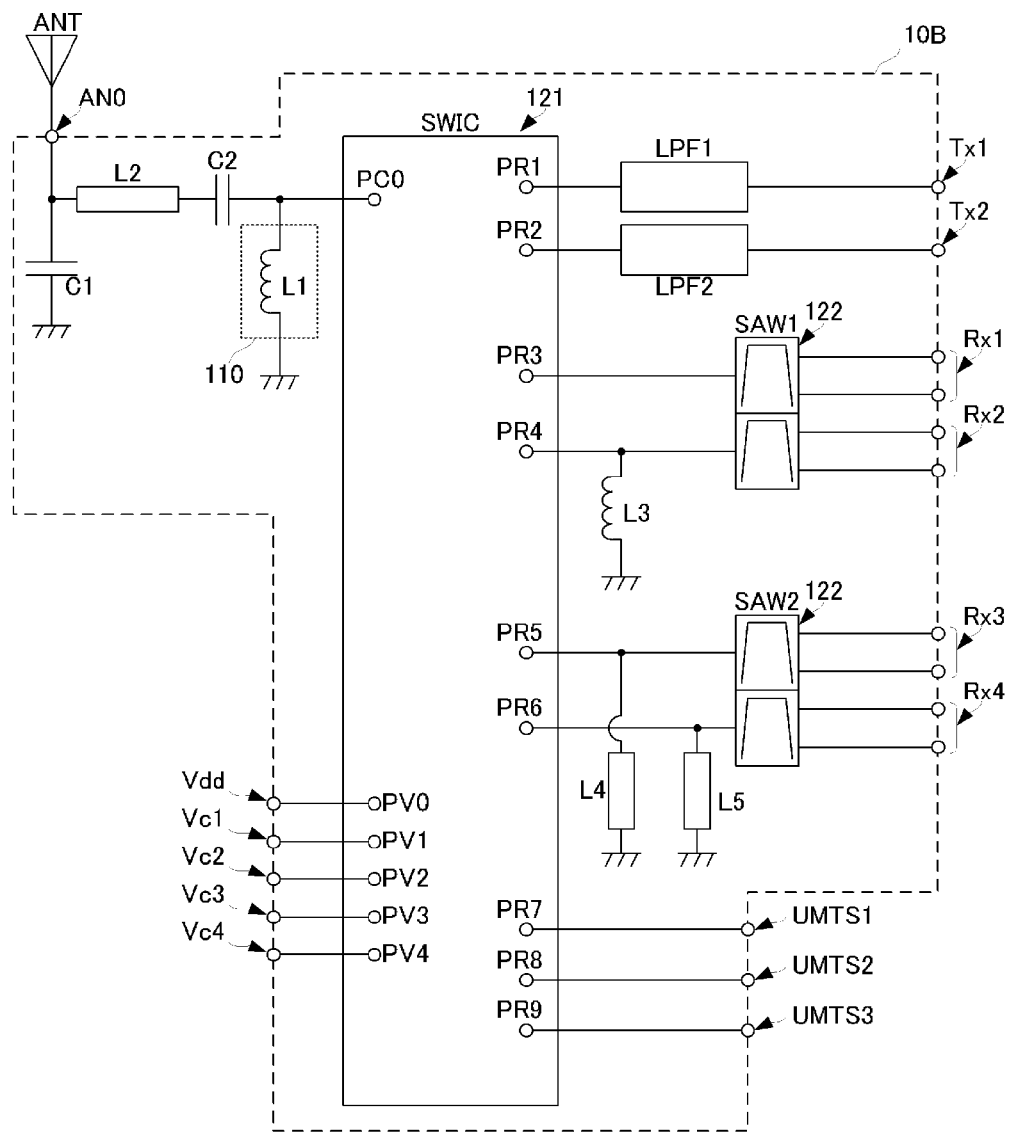
FIG. 6 is a circuit diagram illustrating a schematic circuit configuration of a high-frequency switch module according to a fourth preferred embodiment of the present invention.

Next, a high-frequency switch module according to a fourth preferred embodiment of the present invention will be described with reference to the accompanying drawings. FIG. 6 is a circuit diagram illustrating a schematic circuit configuration of a high-frequency switch module 10B according to the fourth preferred embodiment.

The circuit configuration of the high-frequency switch module 10B is substantially the same as that of the high-frequency switch module 10 according to the first preferred embodiment except that a capacitor C2 is arranged at a transmission line between the antenna port PC0 of the switch IC 121 and the inductor L2.

In the high-frequency switch module 10B, the capacitor C2 is connected between the inductor L2 and a node between the transmission line and the inductor L1. By connecting the capacitor C2 to the transmission line in series, it is possible to further improve an ESD protection function.

Figure 7:
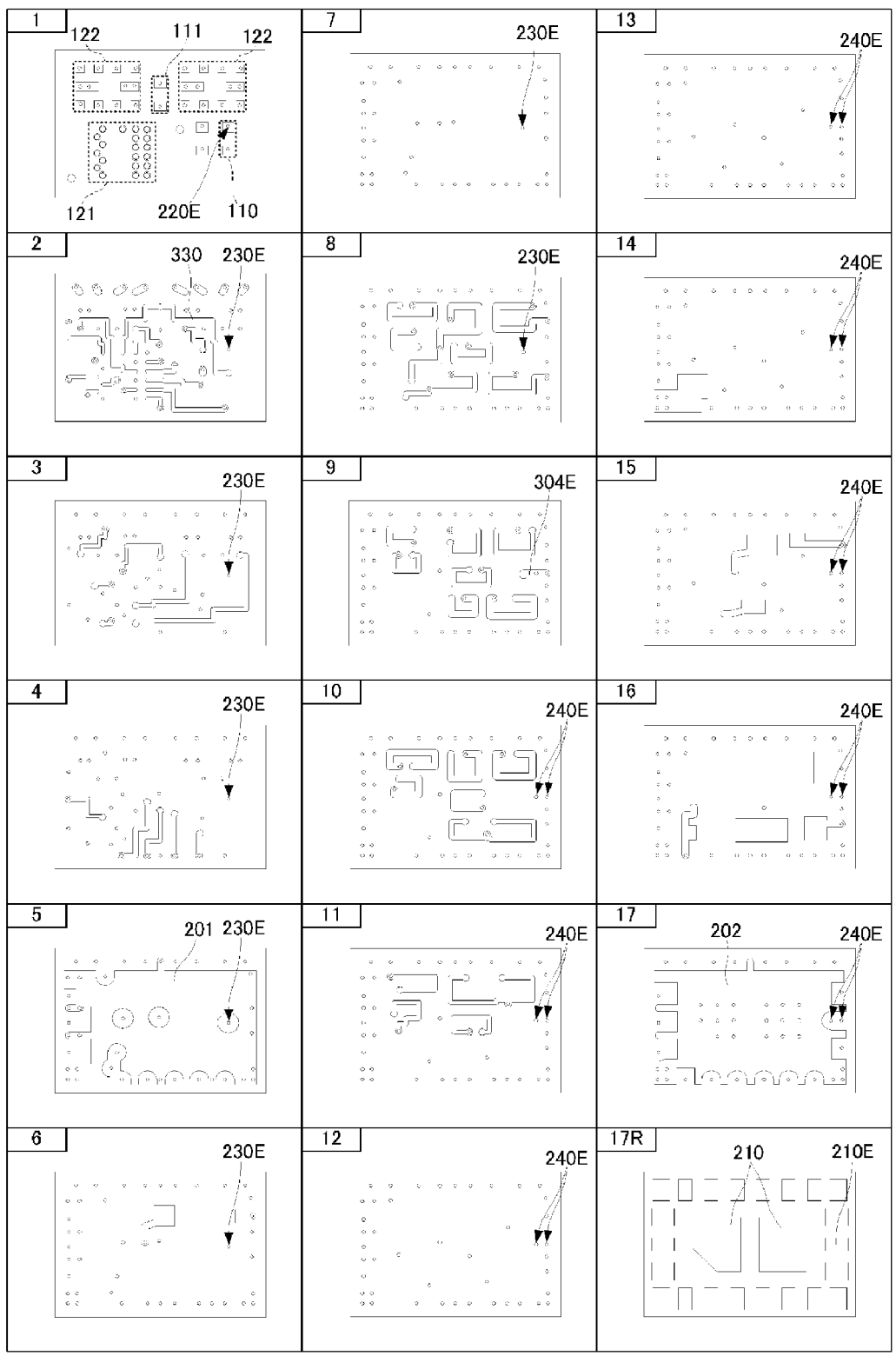
FIG. 7 is a lamination diagram of a multilayer substrate of a high-frequency switch module according to the fourth preferred embodiment of the present invention.
Figure 8:
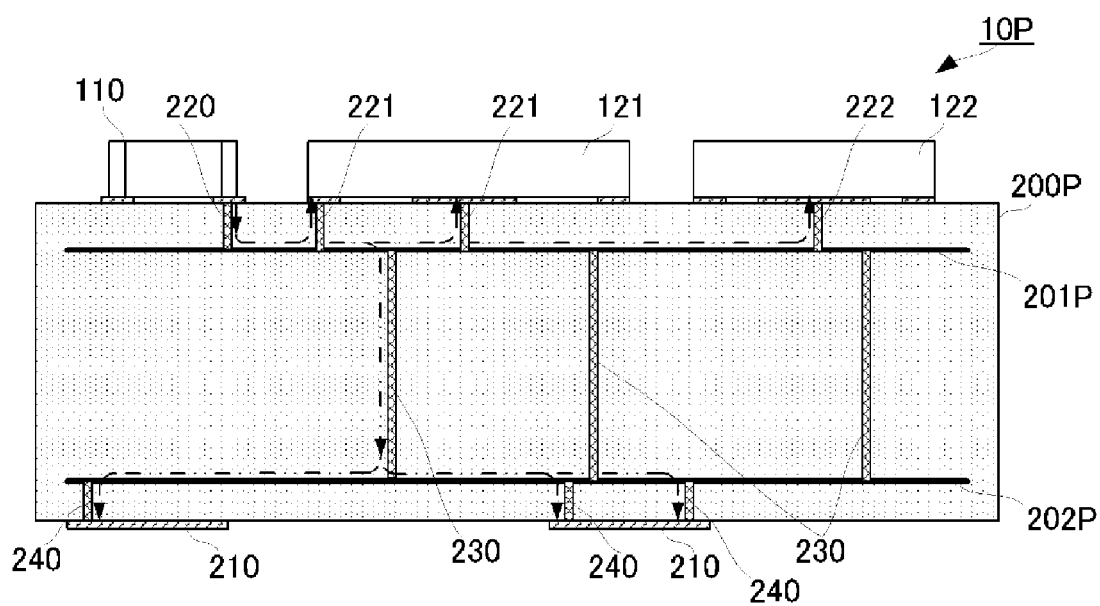
FIG. 8 is a schematic cross-sectional view of a high-frequency switch module in the related art.

Next, the layered structure of the high-frequency switch module 10B will be described. FIG. 7 is a lamination diagram of a multilayer substrate 200B of the high-frequency switch module 10B.

Layers below than the second layer in the multilayer substrate 200B according to this preferred embodiment are preferably the same as those in the multilayer substrate 200 according to the first preferred embodiment, and the description thereof will therefore be omitted.

A first layer corresponds to the upper surface of the multilayer substrate 200B, that is, a mounting surface. A mounting land having a predetermined pattern on which the ESD device 110, the switch IC 121, the two SAW filter elements 122, and a capacitor 111 corresponding to the capacitor C2 are mounted is provided on the first layer. An electrode that is disposed in the lower right portion of the first layer and is parallel or substantially parallel to an electrode for the ESD device 110 is used for the inductor L3. The via hole 220E illustrated in FIG. 2 is provided in the first layer.

On a second layer, a line pattern 330 arranged to connect the electrode for the ESD device 110 and an electrode for the capacitor 111 is provided. The via hole 230E is provided in the second layer. The via hole 230E is connected to one of two lands for the ESD device 110, and the other one of the two lands for the ESD device 110 is connected to the line pattern 330.

The via hole 230E extends from the second layer to an eighth layer.

With the above-described layered structure, it is possible to protect the switch IC 121 and the SAW filter element 122 from an external surge. Furthermore, by providing the capacitor 111 (the capacitor C2), it is possible to more securely and reliably protect the switch IC 121 and the SAW filter element 122 from an external surge.

The capacitor C2 may preferably be connected between the antenna port PC0 and the node between the transmission line and the inductor L1.

Although not described in detail in the above-described preferred embodiments, by appropriately setting the locations of the ESD device 110, the switch IC 121, and the SAW filter element 122, the following effects can be obtained.

For example, as illustrated in FIG. 3, by arranging the ESD device 110 and the switch IC 121 so as to be spaced apart from each other, it is possible to prevent an external surge from directly flowing from the ESD device 110 to the switch IC 121. As illustrated in FIG. 7, by arranging the switch IC 121 and one of the SAW filter elements 122 so as to be spaced apart from the ESD device 110, it is possible to prevent an external surge from directly flowing from the ESD device 110 to the switch IC 121 and the SAW filter element 122. Thus, when there is an element for which preferential protection is required, for example, an element having a low withstand voltage, it is possible to more effectively protect the element from an external surge by increasing the distance between the element and the ESD device 110.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency switch module comprising:
a switch IC including a single common port connected to an antenna and a plurality of separate ports individually connected to a plurality of transmission/reception circuits, the switch IC being arranged to switch between the plurality of separate ports to be connected to the single common port;
an ESD device connected between a ground and a transmission line arranged to connect the single common port of the switch IC and the antenna; and
a multilayer substrate including an upper surface on which the switch IC and the ESD device are mounted and a lower surface on which a first external-connection ground electrode arranged to connect the ESD device to ground and a second external-connection ground electrode arranged to connect the switch IC and the plurality of transmission/reception circuits to ground are provided; and
a first ground connection path arranged to connect the ESD device to the first external-connection ground electrode and a second ground connection path arranged to connect the switch IC and a circuit element included in the plurality of transmission/reception circuits to the second external-connection ground electrode are separately provided in the multilayer substrate.

2. The high-frequency switch module according to claim 1, wherein the first ground connection path includes a plane electrode pattern provided in an inner layer of the multilayer substrate and extending in a direction perpendicular or substantially perpendicular to a lamination direction of the multilayer substrate and a conductive via hole provided in the multilayer substrate and extending in the lamination direction.

3. The high-frequency switch module according to claim 2, wherein, in the multilayer substrate, the inner layer in which the plane electrode pattern of the first ground connection path is provided is different from an inner layer in which a plane electrode pattern included in the second ground connection path is provided.

4. The high-frequency switch module according to claim 1, wherein the first ground connection path is defined solely by a conductive via hole arranged to connect a mounting land on which the ESD device is mounted and the first external-connection ground electrode to each other and extending in the lamination direction.

5. The high-frequency switch module according to claim 1, wherein, on the lower surface of the multilayer substrate, a region in which the first external-connection ground electrode is provided has an area substantially equal to or greater than that of regions in which all other external-connection electrodes are provided.

6. The high-frequency switch module according to claim 1, wherein, in the first ground connection path, a plurality of conductive via holes extending in the lamination direction are connected to the first external-connection ground electrode.

7. The high-frequency switch module according to claim 1, further comprising a capacitor connected in series to the transmission line arranged to be connected to the ESD device.

8. The high-frequency switch module according to claim 1, wherein the circuit element included in the plurality of transmission/reception circuits is a SAW filter element connected to predetermined ones of the plurality of separate ports of the switch IC.

* * * * *